US012604437B2

(12) United States Patent
Siemering et al.

(10) Patent No.: US 12,604,437 B2
(45) Date of Patent: Apr. 14, 2026

(54) COMPACT MODULAR HYBRID HEAT EXCHANGER (CMH2X)

(71) Applicant: Rockwell Collins, Inc., Cedar Rapids, IA (US)

(72) Inventors: Chad A. Siemering, Marion, IA (US); Martin J. Jennings, Oxford, IA (US); Levi D. Van Oort, Clarence, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 230 days.

(21) Appl. No.: 18/236,126

(22) Filed: Aug. 21, 2023

(65) Prior Publication Data

US 2025/0071948 A1     Feb. 27, 2025

(51) Int. Cl.
H05K 7/20          (2006.01)
H05K 7/14          (2006.01)

(52) U.S. Cl.
CPC ....... H05K 7/20436 (2013.01); H05K 7/1427 (2013.01)

(58) Field of Classification Search
CPC .......................... H05K 7/20436; H05K 7/1427
USPC ......................................................... 361/699
See application file for complete search history.

(56) References Cited

U.S. PATENT DOCUMENTS 5,835,349 A * 11/1998 Giannatto .............. H05K 7/202
                                                                        165/104.33
5,982,619 A    11/1999 Giannatto et al.

| | | |
|---|---|---|
| 7,152,126 B2 | 12/2006 | Sandy et al. |
| 7,551,440 B2 | 6/2009 | Belady et al. |
| 7,804,686 B2 | 9/2010 | Parish et al. |
| 8,537,540 B2 | 9/2013 | Landon |
| 8,570,749 B2 | 10/2013 | Tissot |
| 8,687,371 B2 | 4/2014 | Arshad et al. |
| 9,417,670 B2 | 8/2016 | Kaplun et al. |
| 9,807,905 B2 | 10/2017 | Sporer et al. |
| 10,034,403 B1 | 7/2018 | Flannery et al. |
| 10,481,652 B2 | 11/2019 | Rice et al. |
| 10,765,038 B1 | 9/2020 | Leigh et al. |
| 10,791,652 B2 * | 9/2020 | Thompson ......... H05K 7/20509 |
| 10,915,152 B2 | 2/2021 | Isereau et al. |
| 10,928,139 B1 | 2/2021 | Weyant et al. |
| 11,071,221 B2 | 7/2021 | Holahan et al. |
| 11,121,504 B2 | 9/2021 | Jennings et al. |
| 11,363,738 B2 | 6/2022 | Thompson et al. |
| 11,375,626 B2 | 6/2022 | Burrell et al. |
| 11,459,127 B2 | 10/2022 | Duong et al. |

(Continued)

FOREIGN PATENT DOCUMENTS

WO      WO-2015002639 A1 *   1/2015   ......... H05K 7/20163

OTHER PUBLICATIONS

European Search Report received in EP Application No. 24194967. 6, Mar. 25, 2025, 13 pages.

*Primary Examiner* — Zhengfu J Feng
(74) *Attorney, Agent, or Firm* — Suiter Swantz IP

(57)          ABSTRACT

A hybrid cooling approach uses both conduction and convection cooling for circuit cards. The hybrid cooling approach also isolates sensitive circuitry in the circuit cards from the ambient environment. The hybrid cooling approach uses an electronic module with a heat spreader. The heat spreader is coupled to the circuit card. The heat spreader defines openings disposed at an opposite end of a connector. The openings permit a fluid to flow within a cavity defined by the heat spreader.

15 Claims, 9 Drawing Sheets

100

(56) References Cited

U.S. PATENT DOCUMENTS

| | | | |
|---|---|---|---|
| 11,503,701 B1* | 11/2022 | Thompson | H05K 7/20509 |
| 11,632,854 B2 | 4/2023 | Thompson | |
| 11,665,856 B2 | 5/2023 | Thompson et al. | |
| 2004/0070944 A1 | 4/2004 | Wells et al. | |
| 2006/0036794 A1 | 2/2006 | Sandy et al. | |
| 2006/0133033 A1* | 6/2006 | Straub | H05K 7/20563 |
| | | | 361/690 |
| 2008/0113604 A1 | 5/2008 | Tufford et al. | |
| 2016/0262290 A1* | 9/2016 | Chen | F28F 3/04 |

* cited by examiner

100

100

100

100

200

200

COMPACT MODULAR HYBRID HEAT EXCHANGER (CMH2X)

TECHNICAL FIELD

The present invention generally relates to printed circuits, and more specifically to thermal arrangements for cooling.

BACKGROUND

In conduction-cooled modules, heat from a component is transferred to a metal heat spreader through a Thermal Interface Material (TIM) such as a thermal gap pad or thermal grease. The heat spreader conducts heat through a set of card retainers (expanding wedge-lock) and the metallic heat spreader structure into the chassis used in the top-level assembly. At the top-level, this heat is rejected to the ambient environment through natural or forced-convection. While conduction cooling is an effective method for regulating the temperature of circuit components, the heat must pass through several thermal interfaces which results in a series of resistances to overcome.

Alternatively, air-thru modules accounted for in the VITA standards architects the chassis structure in a way that the air from the top-level cooling system (generally provided by a fan or platform-supplied air flow) is provided through a series of top-level chassis airflow passages to each module. At the module, the air is passed through a heatsink structure where heat is accumulated and then rejected downstream into the ambient environment. Though a more direct method of heat rejection, this standardized approach is cumbersome to implement and relies on very specific design considerations to function as intended. Additionally, it does not lend itself well to legacy 3 U/6 U designs because the overall thermal management approach is considerably different between the conduction and air-thru cooled modules.

While conduction cooling is the preferred method for hardware where air-over component cooling is not permitted, conduction cooling does not always take full advantage of the ambient environment for heat rejection. Therefore, it would be advantageous to provide a device, system, and method that addresses the shortcomings described above.

SUMMARY

An electronic module is described. The electronic module includes a circuit card assembly. The electronic module includes a connector. The electronic module includes a pair of card retainers. The circuit card assembly is configured to conduct heat to the card retainers. The electronic module includes a heat spreader. The heat spreader includes a base. The base is in contact with the circuit card assembly. The base defines a cavity. The base defines a plurality of openings. The plurality of openings are disposed at a distal end of the electronic module opposite of the connector. The plurality of openings are connected to the cavity. The heat spreader includes a cover. The cover is coupled to the base; wherein the cover covers the cavity. The heat spreader includes a plurality of fins. The plurality of fins extend from the base. The plurality of fins are disposed within the cavity. The cover is disposed over the plurality of fins.

In some embodiments, the base includes a lip portion and a flat portion. The lip portion and the flat portion define the cavity.

In some embodiments, the flat portion is in contact with the circuit card assembly. The flat portion is disposed between the pair of card retainers.

In some embodiments, the lip portion extends from the flat portion. The lip portion defines the plurality of openings. The cover is coupled to the lip portion by which the cover covers the cavity.

In some embodiments, the cover is hermetically sealed to the lip portion.

In some embodiments, the heat spreader includes a fluid-moving device. The fluid-moving device is disposed within the cavity.

In some embodiments, the plurality of openings comprise a first opening and a second opening. The plurality of fins comprise a first set of fins aligned with the first opening and a second set of fins aligned with the second opening.

In some embodiments, the connector is a card-edge connector and is coupled to an edge of the circuit card assembly.

In some embodiments, the plurality of fins comprise at least one of straight-fins, flared-fins, pin-fins, or plate fins.

In some embodiments, the electronic module includes a pair of alignment blocks. The pair of alignment blocks are coupled to the circuit card assembly. The connector is disposed between the pair of alignment blocks.

In some embodiments, the circuit card assembly is configured to conduct heat to the base and the plurality of fins; wherein the base and the plurality of fins are configured to transfer heat by convection to a fluid within the cavity.

A line-replaceable unit is described. The line-replaceable unit includes a chassis. The chassis defines an expansion slot. The line-replaceable unit includes an electronic module. The electronic modules is disposed within the expansion slot. The electronic module includes a circuit card assembly. The electronic module includes a connector. The electronic module includes a pair of card retainers. The circuit card assembly is configured to conduct heat to the pair of card retainers. The electronic module includes a heat spreader. The heat spreader includes a base. The base is in contact with the circuit card assembly. The base defines a cavity. The base defines a first plurality of openings. The first plurality of openings are disposed at a distal end of the electronic module opposite of the connector. The first plurality of openings are connected to the cavity. The heat spreader includes a cover. The cover is coupled to the base. The cover covers the cavity. The heat spreader includes a plurality of fins. The plurality of fins extend from the base. The plurality of fins are disposed within the cavity. The cover is disposed over the plurality of fins. The heat spreader includes a face plate. The face plate defines a second plurality of openings. The heat spreader includes a gasket. The gasket defines a third plurality of openings. The gasket is disposed between the face plate and the electronic module. The face plate covers the gasket and the electronic module. The first plurality of openings, the second plurality of openings, and the third plurality of openings are aligned.

In some embodiments, the expansion slot is hermetically sealed by the face plate, the gasket, and the electronic module.

In some embodiments, the pair of card retainers are configured to conduct heat to the chassis.

In some embodiments, the line-replaceable unit includes a plurality of the electronic modules, a plurality of the face plates, and a plurality of the gaskets.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the draw- ings.

DETAILED DESCRIPTION OF THE INVENTION

Figure 1A:
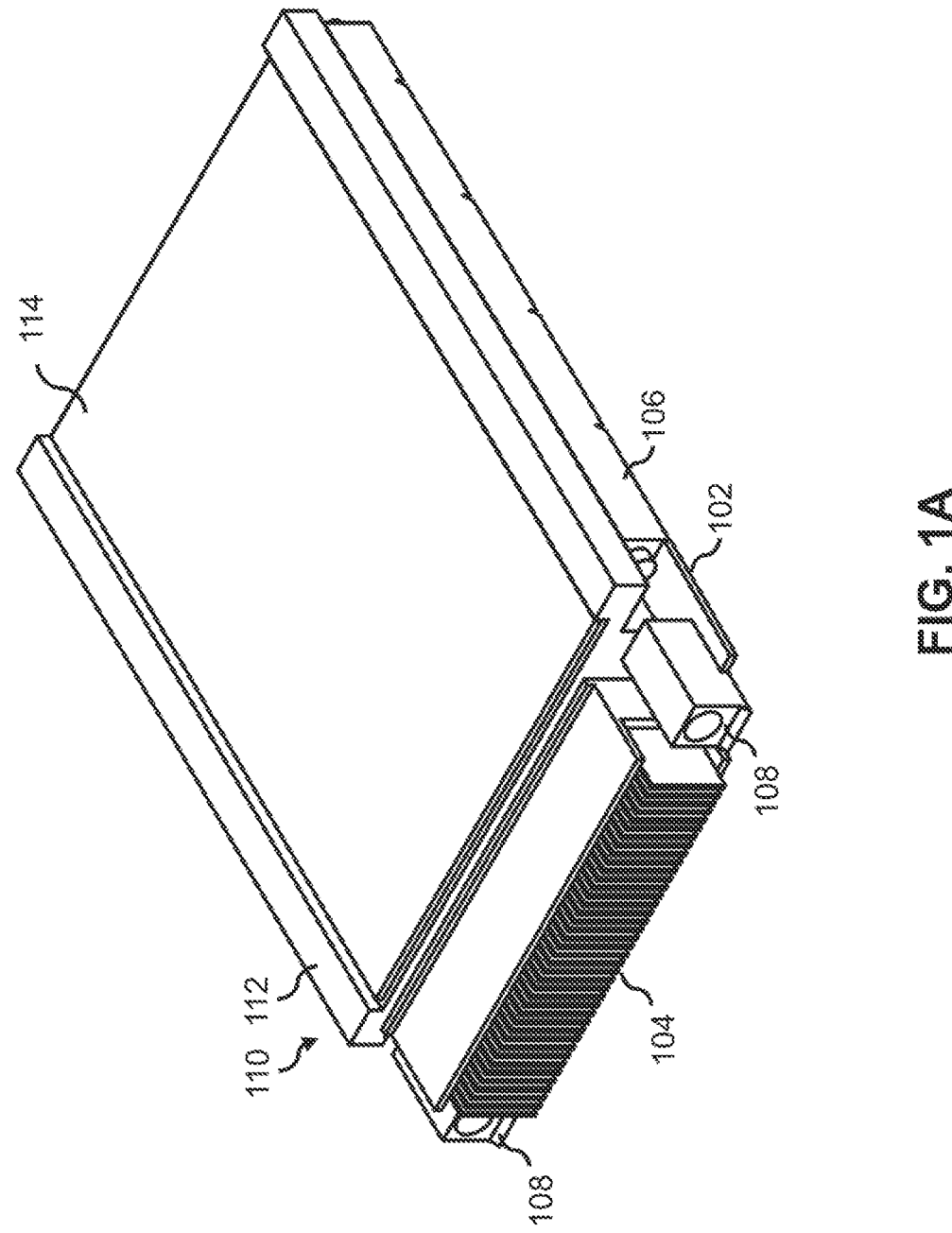
FIG. 1A depicts an isometric view of an electronic module, in accordance with one or more embodiments of the present disclosure.
Figure 1B:
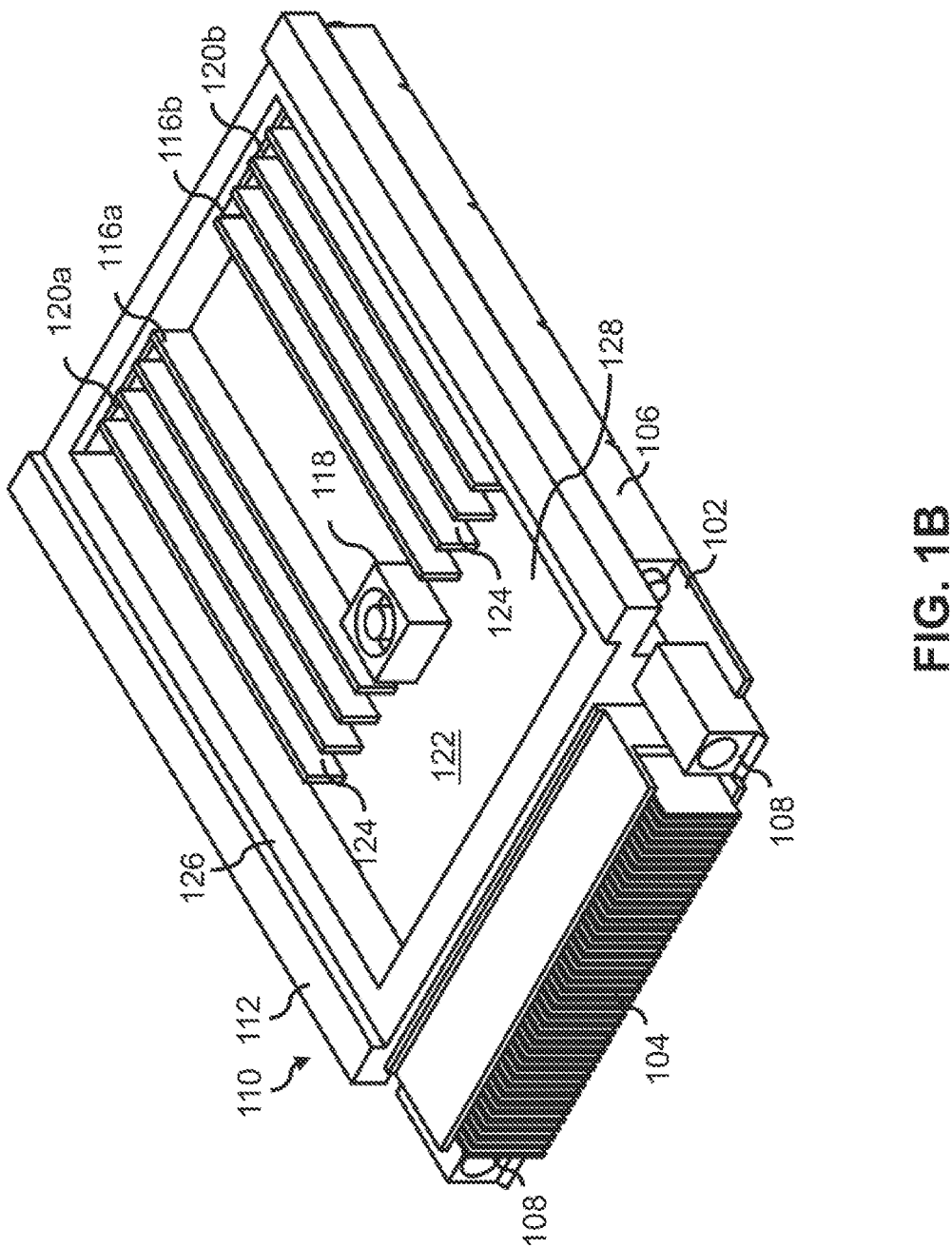
FIG. 1B depicts an isometric view of an electronic module with a cover removed, in accordance with one or more embodiments of the present disclosure.
Figure 1C:
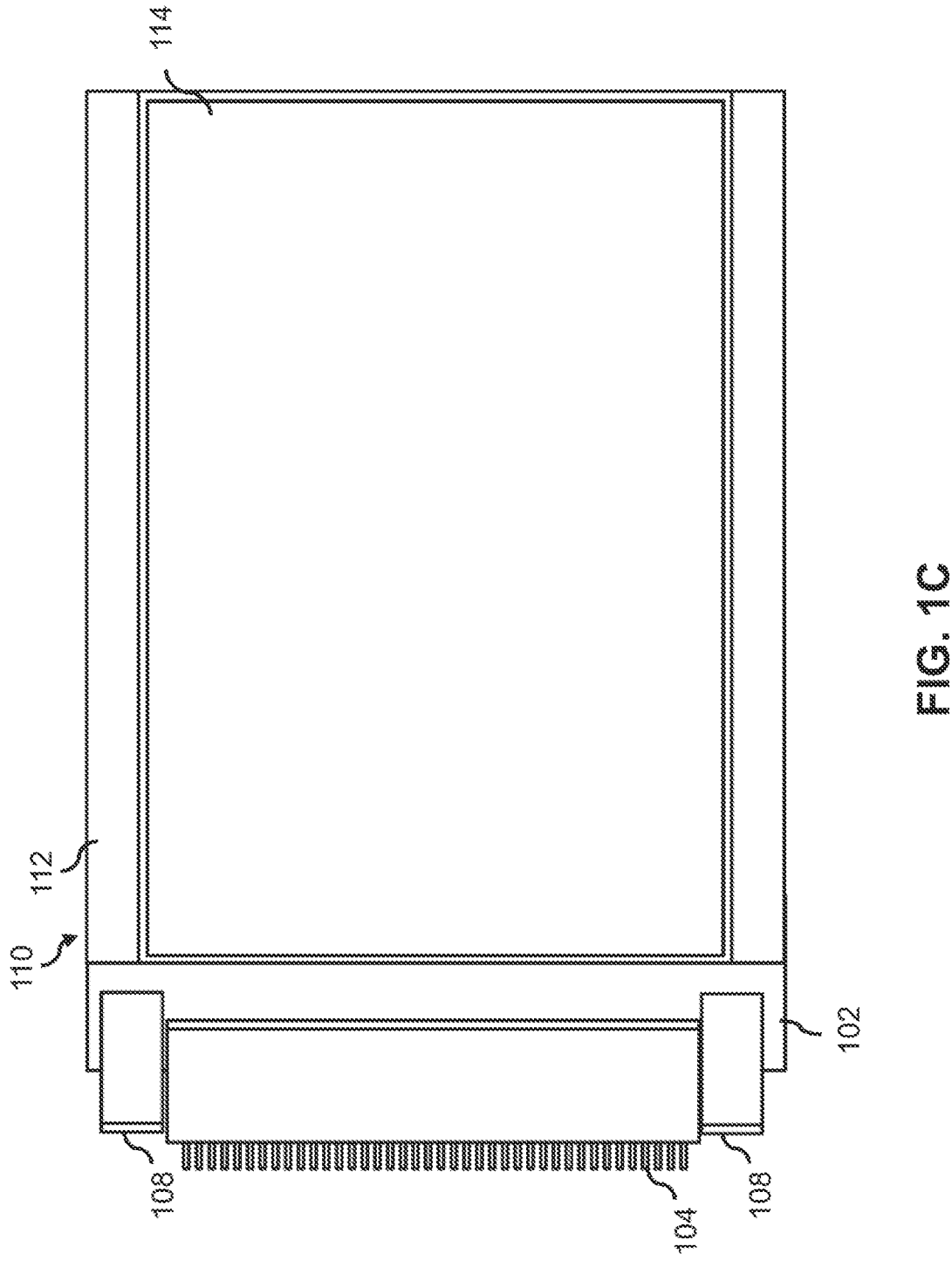
FIG. 1C depicts a top view of an electronic module, in accordance with one or more embodiments of the present disclosure.
Figure 1D:
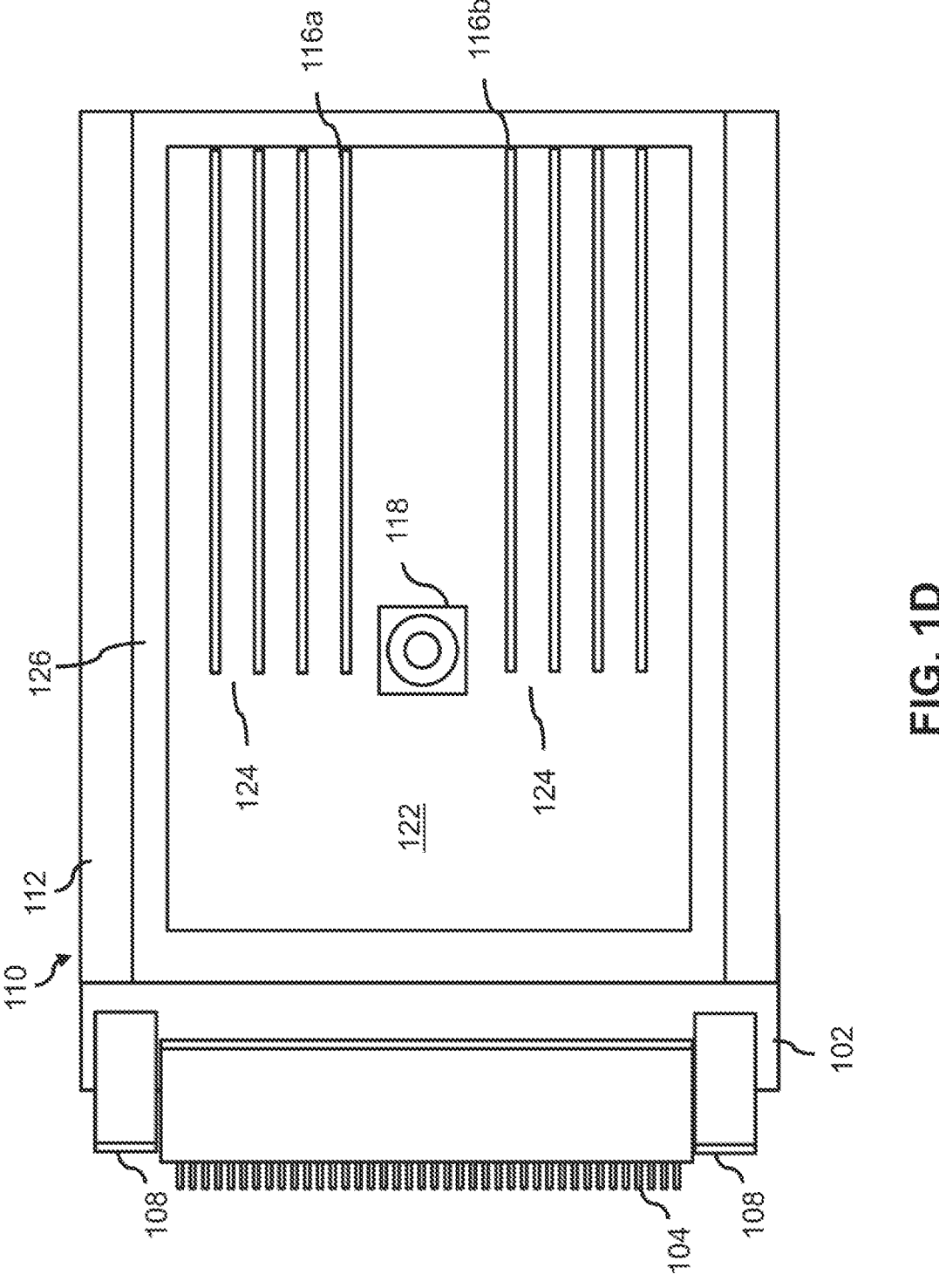
FIG. 1D depicts a top view of an electronic module with a cover removed, in accordance with one or more embodiments of the present disclosure.
Figure 1E:
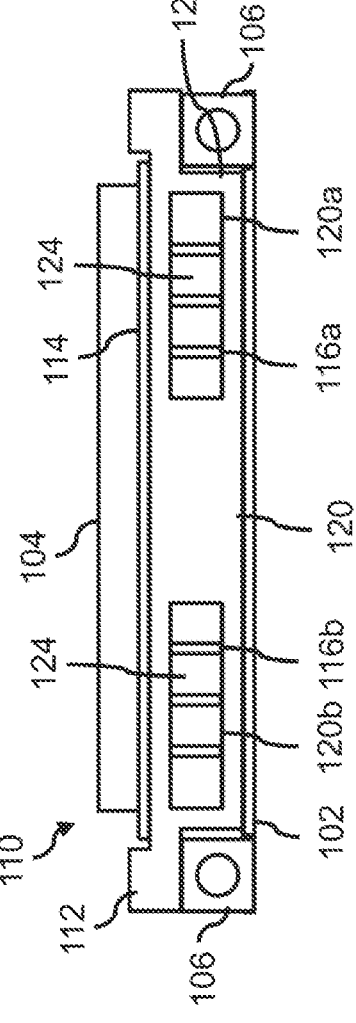
FIG. 1E depicts a rear view of an electronic module, in accordance with one or more embodiments of the present disclosure.
Figure 1F:
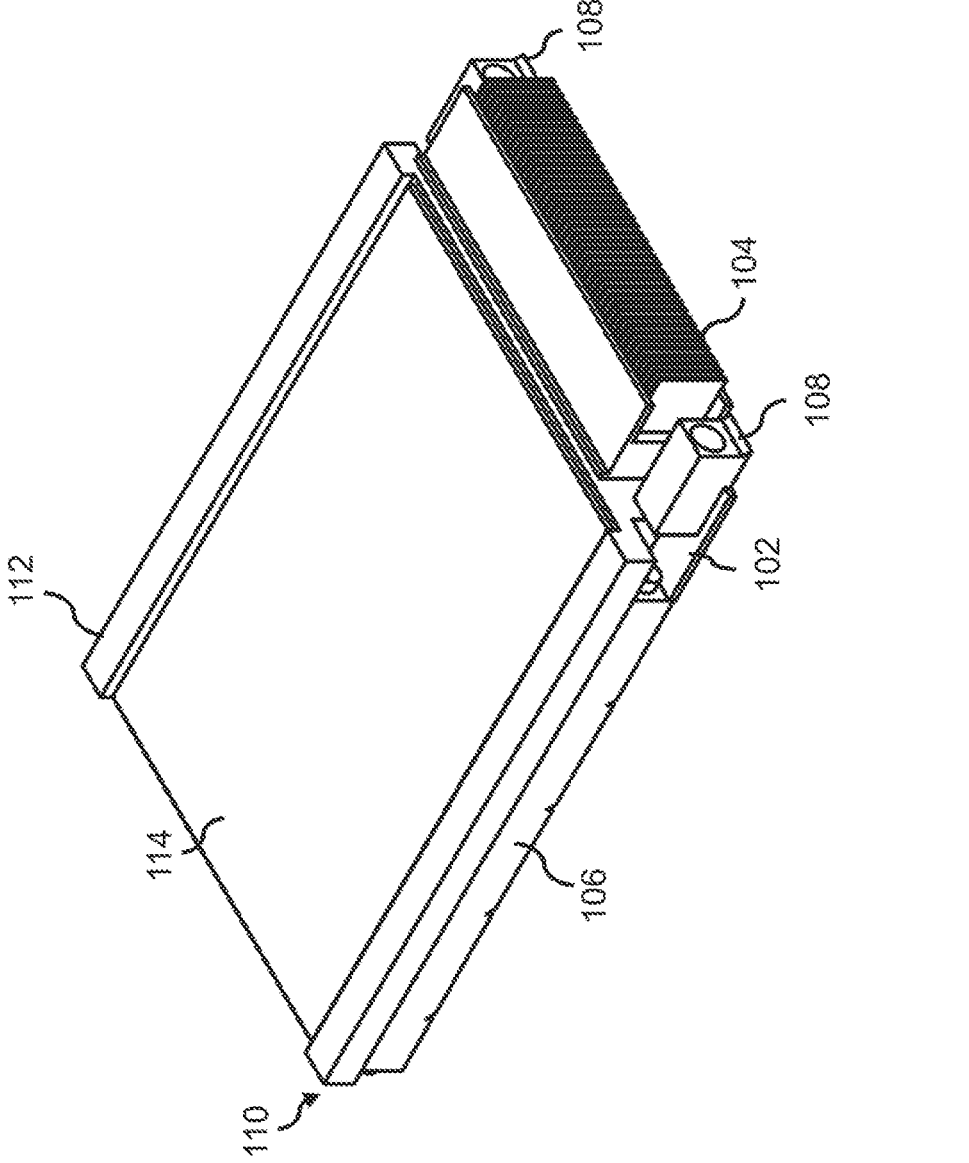
FIG. 1F depicts an isometric view of an electronic module, in accordance with one or more embodiments of the present disclosure.
Figure 1G:
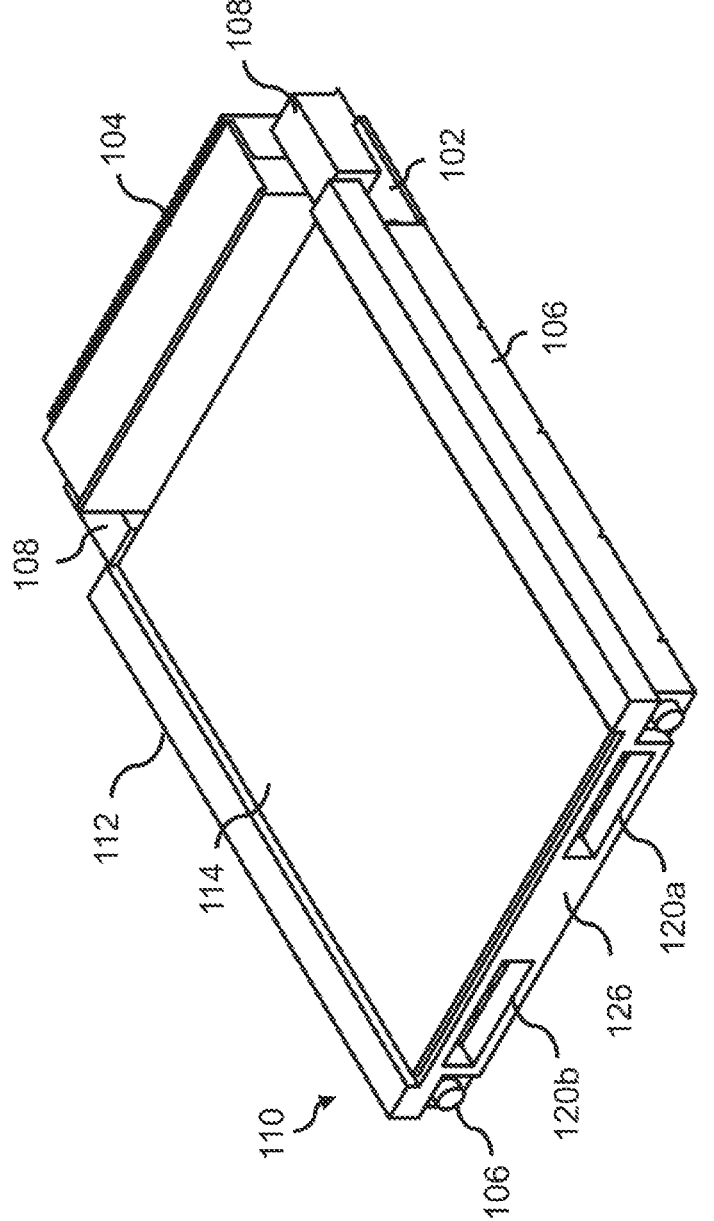
FIG. 1G depicts a rear-isometric view of an electronic module, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Reference will now be made in detail to the subject matter disclosed, which is illustrated in the accompanying drawings. Embodiments of the present disclosure are generally directed to a compact modular hybrid heat exchanger. The heat exchanger is considered a hybrid approach that utilizes both ambient air and chassis conduction cooling. A module uses the heat exchanger as a means for thermal management. The module includes high-power circuitry which is isolated from the ambient environment. The high-power circuitry conducts heat to heat exchanger. The heat exchanger then conducts the heat to a chassis structure and transfers the heat by convection for rejection into the ambient environment.

U.S. Pat. No. 11,121,504, titled "Circuit board separation mechanism"; U.S. Patent Publication No. 2004/0070944, titled "Circuit card module including mezzanine card heat sink and related methods"; U.S. Pat. No. 10,791,652, titled "Systems and methods for heatsink to rail thermal interface enhancement"; U.S. Pat. No. 8,687,371, titled "Tamper respondent module"; U.S. Pat. No. 9,417,670, titled "High power dissipation mezzanine card cooling frame"; U.S. Pat. No. 10,765,038, titled "Floating liquid-cooled cold plate"; U.S. Pat. No. 11,503,701, titled "Electronic device having heat transfer clamp and associated methods"; U.S. Pat. No. 11,632,854, titled "Electronic assemblies having embedded passive heat pipes and associated method"; are each incorporated herein by reference in the entirety.

Referring now to FIGS. 1A-1G, an electronic module 100 is described, in accordance with one or more embodiments of the present disclosure. The electronic module 100 may also be referred to as a module assembly, electronic module assembly, avionics module assembly, a plug-in module, or the like. The electronic module 100 is a component of a line-replaceable unit, as will be described further herein. The electronic module 100 includes one or more of a circuit card assembly 102, connector 104, card retainers 106, alignment blocks 108, heat spreader 110, and the like.

The electronic module 100 includes the circuit card assembly 102 (CCA). The circuit card assembly 102 may include various electronic components. The electronic components can include, but are not limited to, active components (e.g., processors and Integrated Circuit ("IC") chips) and passive components (e.g., resistors, capacitors, inductors, etc.). The electronic components can store data in memory, such as on hard disks, flash memory, RAM, ROM, or any other type of electronic memory. The circuit card assembly 102 may generate heat. The circuit card assembly 102 may generate the heat from any of the various electronic components. Increases in processing demands of the circuit card assembly 102 result in an increased density of power consumption and heat dissipation requirements for the electronic module 100. In some embodiments, the circuit card assembly 102 may include a form factor. For example, the circuit card assembly 102 may include a VITA-defined form factor.

The electronic module 100 includes one or more of the connectors 104. The connector 104 is coupled to the circuit card assembly 102. The connector 104 is provided for electrically connecting the circuit card assembly 102 to external circuitry (e.g., a power source). In some embodiments, the connector 104 is a backplane connector. The connector 104 connects the circuit card assembly 102 to a backplane of line-replaceable unit 200. The connector 104 may include any connector defined in the VITA standards. For example, the connector 104 may include a stacking connector, a card edge connector, a blind-mate connector, a press-fit connector, and the like. In some embodiments, the connector 104 is a press-fit connector installed at the edge of the card.

The electronic module 100 includes the card retainers 106. The card retainers 106 may also be referred to as wedge-lock retainers. The electronic module 100 includes a pair of the card retainers 106. The pair of card retainers 106 are disposed on the opposing sides of the circuit card assembly 102. The card retainers 106 expand to secure the electronic module 100 within the line-replaceable unit 200. The card retainers 106 provide a heat transfer path via conduction. The circuit card assembly 102 is configured to conduct heat to the card retainers 106. The card retainers 106 then conduct the heat to chassis 202 of the line-replaceable unit 200.

The electronic module 100 includes the alignment blocks 108. The alignment blocks 108 may also be referred to as keying blocks, guide blocks, guide pins, and the like. The electronic module 100 includes a pair of the alignment blocks 108. The alignment blocks 108 are coupled to the circuit card assembly 102. The alignment blocks 108 are used to align the connector 104 with a backplane connector of the chassis 202. The connector 104 is disposed between the alignment blocks 108.

The electronic module 100 includes the heat spreader 110. The heat spreader 110 may also be referred to as a heat sink. The heat spreader 110 extends beyond the edge of the circuit card assembly 102. A distal end of the electronic module 100 is defined by the heat spreader 110. A proximal end of the electronic module 100 is defined by the connector 104.

The heat spreader 110 is coupled to the circuit card assembly 102. The heat spreader 110 acts as the main heat transfer and structure member of the electronic module 100. The heat spreader 110 provides cooling for the circuit card assembly 102. For example, the heat spreader 110 receives heat from the circuit card assembly 102 via conduction. The heat spreader 110 provides a conductive cooling pathway and a convective cooling pathway for the circuit card assembly 102. The heat spreader 110 then spreads the heat away from the circuit card assembly 102 via conductive cooling and convective cooling.

The heat spreader 110 includes one or more components, such as, but not limited to, a base 112, cover 114, fins 116, fluid-moving device 118, and the like. One or more components of the heat spreader 110 is made of a material with a relatively high thermal conductivity. For example, the base 112, cover 114, and/or fins 116 are made of aluminum, copper, or the like.

The heat spreader 110 includes base 112. The base 112 is in contact with the card retainers 106 and the circuit card assembly 102. The base 112 is coupled to the card retainers 106 and the circuit card assembly 102. A conductive heat path is defined from the circuit card assembly 102 to the card retainers 106 through the base 112.

The base 112 defines a cavity 122. The cavity 122 may also be referred to as a chamber, a fluid-flow cavity, or the like. The cavity 122 may include any suitable shape. For example, the cavity 122 is depicted as being a cuboid cavity, although this is not intended to be limiting.

The base 112 includes one or more portions. For example, the base 112 includes a lip portion 126 and a flat portion 128. The flat portion 128 of the base 112 is in contact with the circuit card assembly 102. For example, the underside (not depicted) of the flat portion 128 is in contact with the circuit card assembly 102. The flat portion 128 acts to isolate the circuit card assembly 102 from the ambient environment. The base 112 prevents fluid from flowing to the circuit card assembly 102 from the cavity 122. The flat portion 128 is disposed between the pair of card retainers 106. The lip portion 126 extends upwards from the flat portion 128. The lip portion 126 is defined around the flat portion 128. The lip portion 126 is a circumferential edge of around the flat portion 128. The lip portion 126 and the flat portion 128 define cavity 122.

The heat spreader 110 includes cover 114. The cover 114 is coupled to the base 112. The cover 114 covers the cavity 122. The cover 114 is hermetically sealed to the base 112. For example, the cover 114 is hermetically sealed to the lip portion 126. A hermetic seal is any type of sealing that preventing the passage of air, oxygen, or other gases. The cover 114 then prevents a flow of fluid to and from the cavity 122. The cover 114 restricts the flow of fluid from escaping out of the cavity 122. In this regard, the cover 114 encases the cavity 122. In some embodiments, the cover 114 is coupled to the lip portion 126 by which the cover 114 covers the cavity 122. The cover 114 may be hermetically sealed to the lip portion 126 via any technique, such as, but not limited to, an adhesive, a weld, or the like.

The heat spreader 110 includes fins 116. The fins 116 extend upwards from the base 112. For example, the fins 116 extend upwards from the flat portion 128 of the base 112. The fins 116 are disposed within the cavity 122. The cover 114 is disposed over the fins 116.

The fins 116 define one or more ducts 124. The ducts 124 may also be referred to as fluid passageways. The ducts 124 are configured to permit a flow of fluid around the fins 116. The flow of fluid around the fins 116 causes a convective heat transfer of energy from the fins 116 to the fluid. The fins 116 may include a set of fins 116a aligned with the opening 120a and a set of fins 116b aligned with the opening 120b. For example, the heat spreader 110 is depicted as including a set of four fins 116a and a set of four fins 116b, although this is not intended as a limitation of the present disclosure. The set of four fins 116a define three of the ducts 124. Similarly, the set of four fins 116b define three of the ducts 124.

The heat spreader 110 may include any arrangement of the fins 116. For example, the arrangement of the fins may include, but is not limited to, a straight-fins (as-depicted), flared-fins, pin-fins, plate-fins, or the like. The arrangement of the fins may be designed to minimize a forced convection fluid pressure drop through the fins, maximize a heat transfer rate, and/or facilitate manufacturing heat spreader 110. The fins 116 may be fabricated using any suitable fabrication method. For example, the fins 116 may be milled, machined, 3D printed, welded, or the like.

The base 112 defines the openings 120. The base 112 defines a plurality of the openings 120. For example, the base 112 may define at least two of the openings. In some embodiments, the lip portion 126 of the base 112 defines the openings 120. The openings 120 may also be referred to as orifices, holes, or the like. The openings 120 are disposed at the distal end of the electronic module 100 opposite of the connector 104. The openings 120 are connected to the cavity 122. The openings 120 act as an inlet and/or an outlet of the cavity 122 by connecting to the cavity 122. The fluid ingresses to and egresses from the cavity 122 via the openings 120. The base 112 defines a plurality of the openings 120. For example, the base 112 defines at least two of the openings (e.g., opening 120a, opening 120b).

In some embodiments, the heat spreader 110 includes the fluid-moving device 118. The fluid-moving device 118 is coupled to the flat portion 128. The fluid-moving device 118 is disposed in the cavity 122. The fluid-moving device 118 is configured to move the fluid within the cavity 122. The fluid-moving device 118 may include a fan, impeller, geared-pump, and the like. The fluid-moving device 118 may be powered by the circuit card assembly 102, the electronic module 100, line-replaceable unit 200, or the like. In some embodiments, the fluid-moving device 118 is disposed between the set of fins 116a and the set of fins 116b.

The circuit card assembly 102 is configured to conduct heat to the base 112 and the fins 116. The base 112 and the fins 116 are then configured to transfer the heat by convection to a fluid within the cavity 122. The heat spreader 110 receive a fluid from the openings 120. The fluid may include air, a liquid, or the like. The fluid flows from the openings 120 along the fins 116. For example, the fluid flows along the fins 116 within the ducts 124. As the fluid moves through the cavity 122, the fluid accumulates heat from the heat spreader 110. For example, the fluid accumulates heat from the fins 116 and the base 112. For instance, the fluid accumulates heat from the flat portion 128 and the lip portion 126 of the base 112. The heat spreader 110 transfer heats from the circuit card assembly 102 to the fluid. The heated fluid is then moved through the cavity 122 and rejected through the openings 120 by means of the fluid-moving device 118. The fluid flows back to the openings 120 and is exhausted from the openings 120. As may be understood, the fluid may flow in either direction to or from the openings 120. Notably, the flow of the fluid is embedded within the heat spreader 110, and does not flow to the circuit card assembly 102.

Figure 2A:
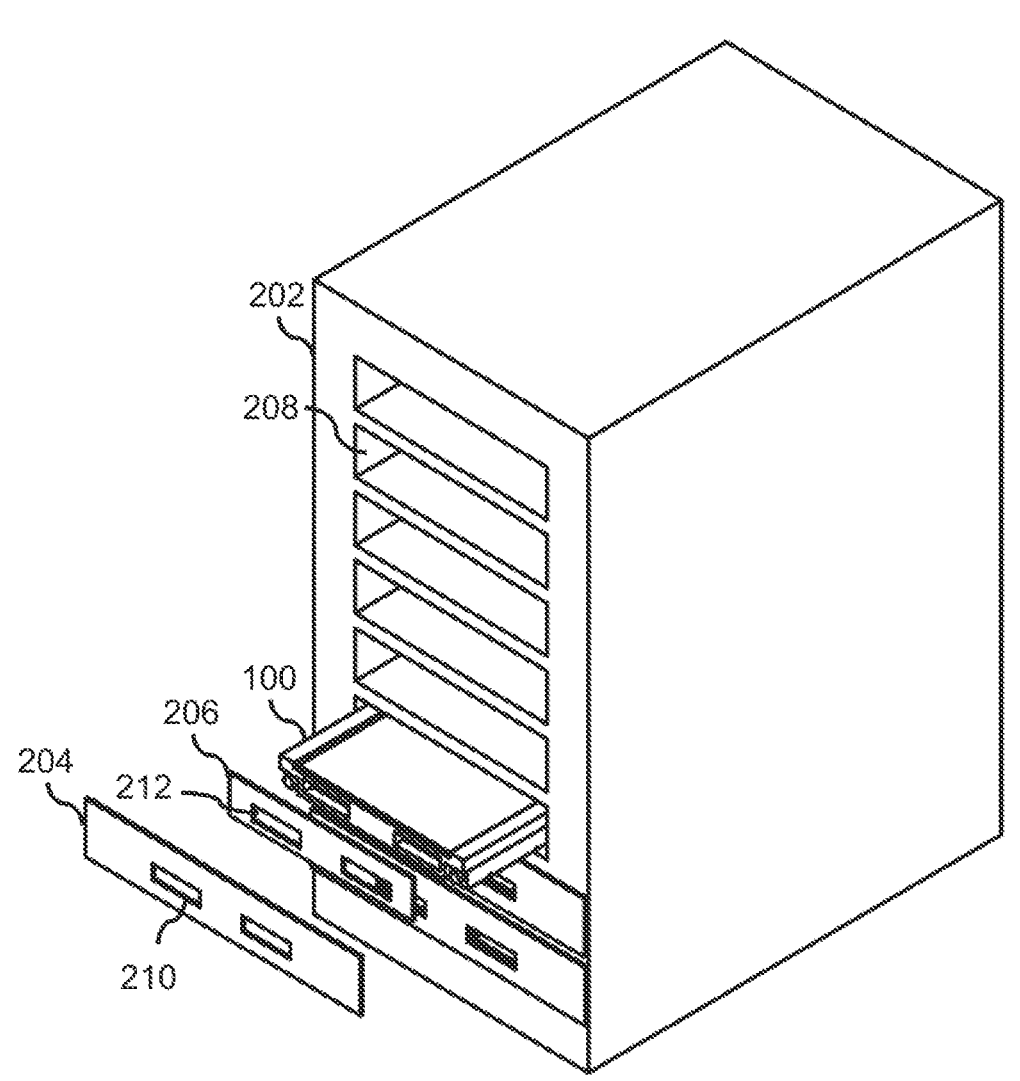
FIG. 2A depicts an isometric view of a line-replaceable unit with a face plate, gasket, and electronic module mid-assembly, in accordance with one or more embodiments of the present disclosure.
Figure 2B:
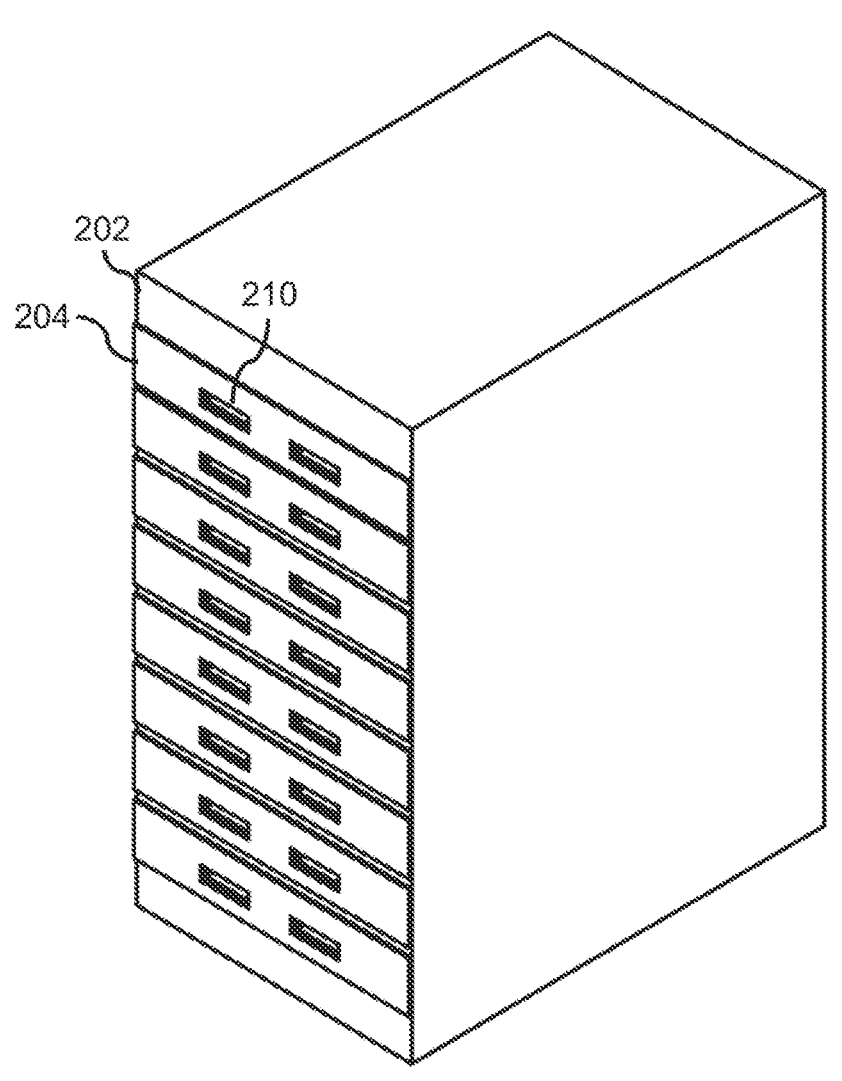
FIG. 2B depicts an isometric view of a line-replaceable unit, in accordance with one or more embodiments of the present disclosure.

Referring now to FIGS. 2A-2B, a line-replaceable unit 200 (LRU) is described, in accordance with one or more embodiments of the present disclosure. The line-replaceable unit 200 may also be referred to as an avionics unit, line-replaceable component, line-replaceable item, or the like. The line-replaceable unit 200 includes one or more components, such as, one or more of the electronic modules 100, chassis 202, face plates 204, gaskets 206, and the like.

The line-replaceable unit 200 includes the electronic modules 100. The electronic modules 100 are oriented such that the electronic modules 100 are installed in the chassis 202 behind the face plate 204 and the gasket 206.

The line-replaceable unit 200 includes the chassis 202. The chassis 202 may also be referred to as a housing, card cage, a rack, or the like. The chassis 202 is populated with the electronic modules 100. The chassis 202 defines expansion slots 208. The expansions slots 208 may also be referred to as bays or the like. The expansion slots 208 may be vertically stacked and/or horizontally stacked in the chassis 202. The electronic modules 100 are disposed within the expansion slots 208. The chassis 202 is depicted as including eight of the expansion slots 208 such that the line-replaceable unit 200 includes eight of the electronic modules 100, face plates 204, gaskets 206, although this is not intended as a limitation of the present disclosure. The line-replaceable unit 200 may include any number of the expansion slots 208, with a matching number of the electronic modules 100.

The chassis 202 includes rails (not depicted) within the expansion slots 208. The electronic modules 100 are slid between two adjacent rails of the expansion slots 208. The chassis 202 includes a backplate (not depicted). The connectors 104 of the electronic modules 100 are coupled to the backplane of the chassis.

The card retainers 106 retain the electronic module 100 to the chassis 202. The electronic modules 100 are retained in the expansion slots 208 of the chassis 202 using the card retainers 106. For example, the card retainers 106 are clamped to the chassis 202. The electronic modules 100 dissipate heat through the card retainers 106 and heat spreader 110 to the chassis 202 via conductive heat transfer. Thus, the electronic modules 100 form a conductive heat transfer path to the chassis 202 through the card retainers 106 and heat spreader 110.

The line-replaceable unit 200 includes the face plates 204. The face plates 204 may also be referred to as an access cover, a top-level module access cover, or the like. The face plates 204 are flat plates. The face plates 204 may also be referred to as a perforated plate. The face plates 204 defines openings 210. The face plates 204 cover the electronic modules 100 and the gaskets 206. In some embodiments, the line-replaceable unit 200 includes multiple of the face plates 204 or a single of the face plate 204. In some embodiments, the line-replaceable unit 200 includes multiple of the face plates 204 each corresponding to number of the electronic modules 100 in the line-replaceable unit. For example, the line-replaceable unit 200 is depicted as including eight of the face plates 204 corresponding to eight of the electronic modules 100, although this is not intended to be limiting. In some embodiments, the line-replaceable unit 200 may include a single face plate 204 with a number of openings 210 corresponding to the number of openings 120 defined by the electronic modules 100. For example, the line-replaceable unit 200 is depicted as including eight of the electronic modules 100 which each define two of the openings 120, for a total of sixteen openings. In this example, the line-replaceable unit 200 may include a single face plate 204 with sixteen of the openings 210.

The line-replaceable unit 200 includes the gasket 206. The gasket 206 may also be referred to as a seal or the like. The gasket 206 may be formed of a deformable material. The gasket 206 may include a sheet gasket, an o-ring gasket, or the like. The gasket 206 defines openings 212. In some embodiments, the line-replaceable unit 200 includes multiple of the gaskets 206 or a single of the gaskets 206. In some embodiments, the line-replaceable unit 200 includes multiple of the gaskets 206 each corresponding to number of the electronic modules 100 in the line-replaceable unit. For example, the line-replaceable unit 200 is depicted as including eight of the gaskets 206 corresponding to eight of the electronic modules 100, although this is not intended to be limiting. In some embodiments, the line-replaceable unit 200 may include a single gasket 206 with a number of openings 212 corresponding to the number of openings 120 defined by the electronic modules 100. For example, the line-replaceable unit 200 is depicted as including eight of the electronic modules 100 which each define two of the openings 120, for a total of sixteen openings. In this example, the line-replaceable unit 200 may include a single gasket 206 with sixteen of the openings 212. In some embodiments, the line-replaceable unit 200 includes multiple of the gaskets 206 each corresponding to number of the openings 120 defined by the electronic modules 100. Each of the openings 120 of the electronic modules 100 may include a separate of the gaskets 206. For example, the line-replaceable unit 200 is depicted as including eight of the electronic modules 100 which each define two of the openings 120, for a total of sixteen openings. In this example, the line-replaceable unit 200 may include sixteen of the gaskets 206, each for a separate of the openings 120.

The gasket 206 is disposed between the electronic module 100 and the face plate 204. For example, the gasket 206 is disposed between the heat spreader 110 of the electronic module 100 and the face plate 204. For instance, the gasket 206 is disposed between both the lip portion 126 and the flat portion 128 of heat spreader 110 and the face plate 204. The gasket 206 is a mechanical seal which fills the space between the electronic module 100 and the face plate 204. The face plate 204 compresses the gasket 206 into the electronic module 100. The gasket 206 creates a sealed interface between the heat spreader 110 and the face plate 204.

The heat exchanger assembly 110 is in fluid communication with an ambient environment by way of the face plate 204 and the gasket 206. A fluid may pass through the face plates 204 and the gasket 206 to the electronic modules 100 without the fluid going into the expansion slots 208. The openings 120 defined by the heat spreader 110, the openings 212 defined by the gasket 206, and the openings 210 defined by the face plate 204 are aligned. In this regard, one or more openings extends through the face plate 204, the gasket 206, and the heat spreader 110 to the cavity 122. The openings 120, openings 210, and openings 212 permit a flow of fluid from outside the line-replaceable unit 200 through the face plate 204, the gasket 206, and the heat spreader 110 to the cavity 122. The dimensions of the openings 120, the openings 210, and the openings 212 control a flow rate of the fluid.

The cavity 122 receives the fluid from the ambient environment. The fluid is then heated by the heat spreader 110, thereby cooling the circuit card assembly 102. The heated fluid is then rejected back through the openings 120, openings 210, and openings 212 to the ambient environment. In this regard, the electronic module 100 uses conduction cooling and convection cooling to dissipate heat from the circuit card assembly 102. The electronic module 100 uses a hybrid approach to thermal management taking advantage of both conduction and convection heat transfer methods.

In some embodiments, the expansion slot 208 is hermetically sealed. In this regard, fluid may not pass over the circuit card assemblies 102 of the electronic modules 100. The line-replaceable unit 200 is hermetically sealed to prevent exposing the circuit card assembly 102 to contaminants, such as, water, chemicals, or the like. The expansion slots 208 are hermetically sealed by the face plate 204, the gasket 206, and the electronic modules 100.

Referring Generally Again to FIGS. 1A-2B.

In some embodiments, the electronic module 100 follows one or more standards and/or guidelines. For example, the standards and/or guidelines may be set forth by the VMEbus International Trade Association (VITA). For instance, the standards and/or guidelines may include, but are not limited to, VITA 42.0, VITA 46.0, and VITA 48.2. In some embodiments, the electronic module 100 is a VITA 3 U-style or 6 U-style electronic module. The VITA 3 U-style and 6 U-style electronic module have an industry standard, size, width, length, form factor. For example, the VITA 3 U-style electronic module includes a width of 3.937 inches. By way of another example, the VITA 6 U-style electronic module includes a height of 9.187 inches. In some embodiments, the VITA 3 U-style and 6 U-style electronic module include Switch Mezzanine Card (XMC) and/or Peripheral Component Interconnect (PCI) Mezzanine Card (PMC) connector designs.

Although embodiments of the disclosure discuss conforming to standards and/or guidelines set forth by VITA, it is noted herein the electronic modules and/or line-replaceable units may be configured (e.g., in addition to or in the alternative to VITA) in accordance with aviation guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like. Therefore, the above description should not be interpreted as a limitation on the present disclosure but merely an illustration.

In some embodiments, the fluid-moving device 118 is engaged during peak powers. The fluid-moving device 118 may be controlled from a controller (not depicted). The electronic module 100 may include the controller. The controller may control the fluid-moving device 118 based on the power of the circuit card assembly 102.

It is noted herein "coupled" may mean one or more of communicatively coupled, electrically coupled, and/or physically coupled for the purposes of the present disclosure. As used herein, coupled may refer to a direct or indirect coupling. An indirect coupling may refer to a connection via another function element. A direct coupling may refer to a connection without intermediary functional elements. It is noted herein that by being "coupled between", it may be understood to be between two or more components, and may additionally include intervening components therein. An electrical coupling or electrical connection may refer to the ability of electrical energy to flow between components. The terms electrical coupling and electrical connection may be used interchangeably. An interconnection refers to the arrangement of conductive and insulating regions electrically connecting the respective electrodes of at least two components. A mechanical coupling or mechanical attachment may refer to a physical support of components. The terms mechanical coupling and mechanical attachment may be used interchangeably.

The methods, operations, and/or functionality disclosed may be implemented as sets of instructions or software readable by a device. The steps may include computations which may be performed simultaneously, in parallel, or sequentially. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented. It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly inter-actable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An electronic module comprising:
   a circuit card assembly;
   a connector;
   a pair of card retainers; wherein the circuit card assembly is configured to conduct heat to the pair of card retainers; and
   a heat spreader comprising:
      a base; wherein the base is in contact with the pair of card retainers and the circuit card assembly; wherein a conductive heat path is defined from the circuit card assembly to the pair of card retainers through the base; wherein the base defines a cavity; wherein the base defines a plurality of openings; wherein the plurality of openings are disposed at a distal end of the electronic module opposite of the connector; wherein the plurality of openings are connected to the cavity;

a cover; wherein the cover is coupled to the base; wherein the cover covers the cavity; and a plurality of fins; wherein the plurality of fins extend from the base; wherein the plurality of fins are disposed within the cavity; wherein the cover is disposed over the plurality of fins.

2. The electronic module of claim 1, the base comprising a lip portion and a flat portion; wherein the lip portion and the flat portion define the cavity.

3. The electronic module of claim 2, wherein the flat portion is in contact with the circuit card assembly; wherein the flat portion is disposed between the pair of card retainers.

4. The electronic module of claim 3, wherein the lip portion extends from the flat portion; wherein the lip portion defines the plurality of openings; wherein the cover is coupled to the lip portion by which the cover covers the cavity.

5. The electronic module of claim 4, wherein the cover is hermetically sealed to the lip portion.

6. The electronic module of claim 1, the heat spreader comprising a fluid-moving device; wherein the fluid-moving device is disposed within the cavity; wherein the fluid-moving device is powered by the circuit card assembly.

7. The electronic module of claim 6, wherein the plurality of openings comprise a first opening and a second opening; wherein the plurality of fins comprise a first set of fins aligned with the first opening and a second set of fins aligned with the second opening; wherein the fluid-moving device is disposed between the first set of fins and the second set of fins.

8. The electronic module of claim 1, wherein the connector is a card-edge connector and is coupled to an edge of the circuit card assembly.

9. The electronic module of claim 1, wherein the plurality of fins comprise at least one of straight-fins, flared-fins, pin-fins, or plate fins.

10. The electronic module of claim 1, comprising a pair of alignment blocks; wherein the pair of alignment blocks are coupled to the circuit card assembly; wherein the connector is disposed between the pair of alignment blocks.

11. The electronic module of claim 1, wherein the circuit card assembly is configured to conduct heat to the base and the plurality of fins; wherein the base and the plurality of fins are configured to transfer heat by convection to a fluid within the cavity.

12. A line-replaceable unit comprising:

a chassis; wherein the chassis defines an expansion slot;

an electronic module; wherein the electronic module is disposed within the expansion slot;

the electronic module comprising:

a circuit card assembly;

a connector;

a pair of card retainers; wherein the circuit card assembly is configured to conduct heat to the pair of card retainers; and a heat spreader comprising:

a base; wherein the base is in contact with the pair of card retainers and the circuit card assembly; wherein a conductive heat path is defined from the circuit card assembly to the pair of card retainers through the base; wherein the base defines a cavity; wherein the base defines a first plurality of openings; wherein the first plurality of openings are disposed at a distal end of the electronic module opposite of the connector; wherein the first plurality of openings are connected to the cavity;

a cover; wherein the cover is coupled to the base; wherein the cover covers the cavity; and a plurality of fins; wherein the plurality of fins extend from the base; wherein the plurality of fins are disposed within the cavity; wherein the cover is disposed over the plurality of fins;

a face plate; wherein the face plate defines a second plurality of openings; and a gasket; wherein the gasket defines a third plurality of openings; wherein the gasket is disposed between the face plate and the electronic module;

wherein the face plate covers the gasket and the electronic module;

wherein the first plurality of openings, the second plurality of openings, and the third plurality of openings are aligned.

13. The line-replaceable unit of claim 12, wherein the expansion slot is hermetically sealed by the face plate, the gasket, and the electronic module.

14. The line-replaceable unit of claim 12, wherein the pair of card retainers are configured to conduct heat to the chassis.

15. The line-replaceable unit of claim 12, comprising at least one additional electronic module, at least one additional face plate, and at least one additional gasket.

* * * * *